(12) United States Patent
Lacey et al.

(10) Patent No.: US 8,866,485 B1
(45) Date of Patent: Oct. 21, 2014

(54) COMBINATION RECEPTACLE AND PLUG CIRCUIT TESTER

(75) Inventors: Darron Kirby Lacey, Peachtree City, GA (US); Qi Hui, Shanghai (CN); Erik Jeffrey Gouhl, Fayetteville, GA (US); Carlos Eduardo Restrepo, Atlanta, GA (US)

(73) Assignee: Cooper Technologies Company, Houston, TX (US)

( * ) Notice: Subject to any disclaimer, the term of this patent is extended or adjusted under 35 U.S.C. 154(b) by 482 days.

(21) Appl. No.: 13/251,443

(22) Filed: Oct. 3, 2011

Related U.S. Application Data

(60) Provisional application No. 61/389,138, filed on Oct. 1, 2010.

(51) Int. Cl.
*G01R 31/00* (2006.01)
*H01R 25/00* (2006.01)

(52) U.S. Cl.
CPC .................................... *H01R 25/003* (2013.01)
USPC .......................................................... 324/508

(58) Field of Classification Search
None
See application file for complete search history.

(56) References Cited

U.S. PATENT DOCUMENTS

| | | |
|---|---|---|
| 3,952,244 A | 4/1976 | Spear |
| 3,967,195 A | 6/1976 | Averitt et al. |
| 4,015,201 A | 3/1977 | Chaffee |
| 4,034,284 A | 7/1977 | Peplow et al. |
| 4,082,995 A | 4/1978 | Rhude |
| 4,105,968 A | 8/1978 | Mobley et al. |
| 4,118,690 A | 10/1978 | Paynton |
| 4,127,807 A | 11/1978 | Peplow et al. |
| 4,152,639 A | 5/1979 | Chaffee |
| 4,280,092 A | 7/1981 | Wells, Jr. et al. |
| 5,285,163 A | 2/1994 | Liotta |
| 5,625,285 A | 4/1997 | Virgilio |
| 5,642,052 A | 6/1997 | Earle |
| 6,054,849 A | 4/2000 | Collier et al. |
| 6,072,317 A | 6/2000 | Mackenzie |
| 6,218,844 B1 | 4/2001 | Wong et al. |
| 6,323,652 B1 | 11/2001 | Collier et al. |
| 6,629,169 B2 * | 9/2003 | Chu ................................ 710/72 |
| 6,982,558 B2 | 1/2006 | Bryndzia et al. |
| 7,057,401 B2 | 6/2006 | Blades |
| 7,068,038 B2 | 6/2006 | Mason et al. |
| 7,091,723 B2 | 8/2006 | Simmons et al. |
| 7,199,587 B2 | 4/2007 | Hurwicz |
| 7,248,056 B2 | 7/2007 | Waldschmidt |
| 7,259,567 B2 | 8/2007 | Sears et al. |
| 7,385,406 B1 | 6/2008 | Blades |
| 7,528,609 B2 | 5/2009 | Savicki, Jr. |
| 8,610,313 B2 * | 12/2013 | Makwinski ................... 307/122 |
| 2006/0103390 A1 | 5/2006 | Simmons et al. |

\* cited by examiner

*Primary Examiner* — Paresh Patel
(74) *Attorney, Agent, or Firm* — King & Spalding LLP

(57) ABSTRACT

An electrical circuit tester includes a first testing device and a second testing device provided in a hand-held housing, each being electrically isolated from the other. Multiple light sources are electrically coupled to one of the first and second testing devices to provide a visual indication of the testing result. The first testing device includes a conventional three-prong plug extending out from the surface of the housing and configured to be inserted into a standard electrical receptacle. The second testing device includes one or more keyed cavities, each being designed to receive all or a portion of a plug into the cavity in only one orientation. Each cavity can include at least one blade prong that makes electrical contact with the plug when inserted into the cavity. Both the first and second testing devices can be operated simultaneously with separate sets of light sources providing separate testing indications for each.

20 Claims, 11 Drawing Sheets

COMBINATION RECEPTACLE AND PLUG CIRCUIT TESTER

RELATED PATENT APPLICATION

This application claims priority under 35 U.S.C. §119 to U.S. Provisional Patent Application Ser. No. 61/389,138, filed Oct. 1, 2010, and titled "Combination Receptacle and Modular Plug Circuit Tester," the entire contents of which are hereby incorporated herein by reference for all purposes.

TECHNICAL FIELD

The present disclosure relates generally to testing of wiring devices and more particularly to systems, methods, and devices for a combination receptacle and plug circuit tester.

BACKGROUND

Various circuit testers have been developed for testing the correctness of the wiring of three-wire ground type electrical household outlets or receptacles. A number of these devices comprise three lamps connected between the prongs of a three-prong standard plug and disposed within a suitable housing. When such a circuit tester is plugged into the outlet being tested the combinations of energized lamps indicate whether or not the wiring of the outlet is correct.

However, modular wiring systems have been created that would provide the ability to test wiring before conventional wall receptacles have been installed. Providing a mechanism to test these modular wiring systems would allow for problems to be caught earlier on in the installation process and would require less disassembly, since the conventional receptacle or wall switch would not yet be installed. Furthermore, providing a device that is capable of testing both conventional receptacles and modular wiring systems in a single device would eliminate the need to carry multiple testers. Finally, conventional testers with add-on features to test additional components typically include circuitry that interconnects all of the testing components. This leads to situations where, when one portion of the tester is being used, the other portions must be covered, retracted or switched to a non-enabled state to prevent a shock hazard. Providing an electrical testing device with electrically separate testing systems eliminates the potential for shock hazard, and provides the ability to test multiple types of devices simultaneously.

SUMMARY

The present disclosure provides novel apparatus, systems, and methods for providing a hand-held electrical circuit tester capable of testing multiple different types of circuits while electrically isolating the individual testing components to increase safety and reduce the risk of shock. For one aspect of the present invention, a novel hand-held apparatus for testing electrical circuits includes a housing. The apparatus also includes a first circuit tester extending out from a first portion of the housing and a second circuit tester disposed along another portion of the housing. The second circuit tester is electrically isolated from the first circuit tester. The apparatus also includes a means for providing a visual indication of an installation status for at least one of the first and second circuit tester provided along a surface of the housing.

For another aspect of the present invention, a hand-held apparatus for testing electrical circuits includes a non-conductive housing that has multiple side walls, top and bottom walls coupled to the side walls and a cavity defined by the top, bottom, and side walls. The apparatus also includes a printed circuit board (PCB) disposed within the cavity. The PCB includes a first electrical circuit and a second electrical circuit, the two circuits being electrically isolated from one another. Further, the apparatus includes a first electrical circuit tester, a second electrical circuit tester, and multiple light sources. The first electrical circuit tester is electrically coupled to the first electrical circuit on the PCB and has multiple prongs that extend out from the housing. The second electrical circuit tester is electrically coupled to the second electrical circuit on the PCB and includes at least one cavity for receiving at least a conductive portion of a plug within the cavity. The light sources are electrically coupled to the PCB and provide a visual indication of the installation status for one or both of the first and second electrical circuit testers.

These and other aspects, features, and embodiments of the invention will become apparent to a person of ordinary skill in the art upon consideration of the following detailed description of illustrated embodiments exemplifying the best mode for carrying out the invention as presently perceived.

BRIEF DESCRIPTION OF THE DRAWINGS

Reference will now be made to the accompanying drawings, which are not necessarily drawn to scale, and wherein:

FIG. 4D is another cut-away view of the internal components of the alternative combination receptacle and modular plug circuit testing device of FIG. 4A presenting a slide switch in a second position in accordance with one exemplary embodiment The drawings illustrate only exemplary embodiments of the invention and are therefore not to be considered limiting of its scope, as the invention may admit to other equally effective embodiments. The elements and features shown in

DETAILED DESCRIPTION OF THE EXEMPLARY EMBODIMENTS

Figure 1A:
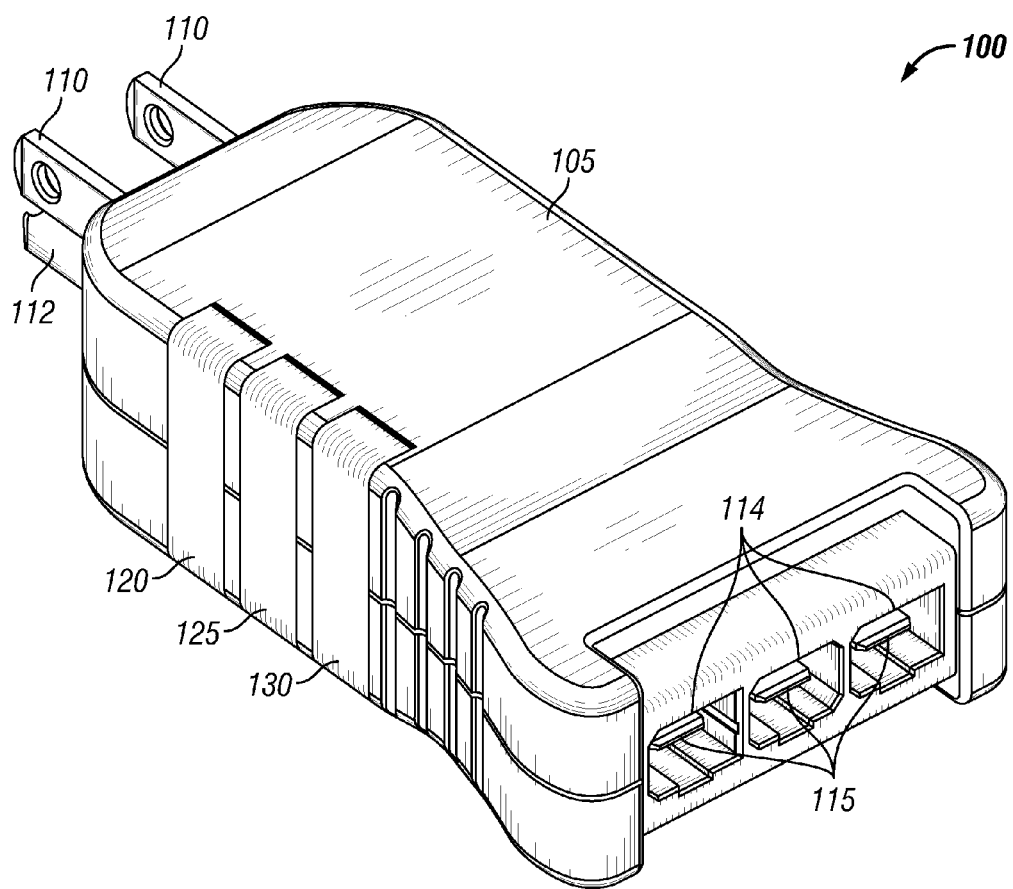
FIG. 1A is a perspective view of the combination receptacle and modular plug circuit testing device in accordance with one exemplary embodiment.
Figure 1B:
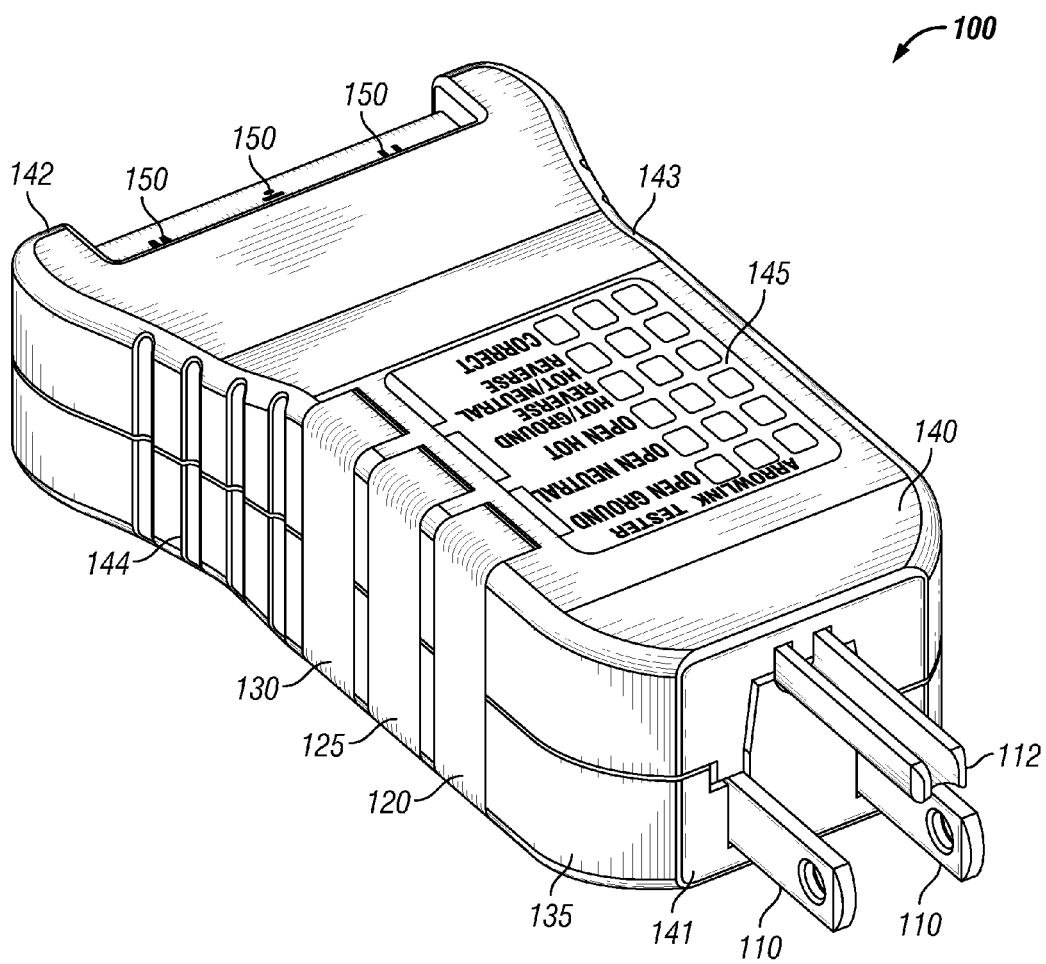
FIG. 1B is another perspective view of the combination receptacle and modular plug circuit testing device of FIG. 1A in accordance with one exemplary embodiment.
Figure 1C:
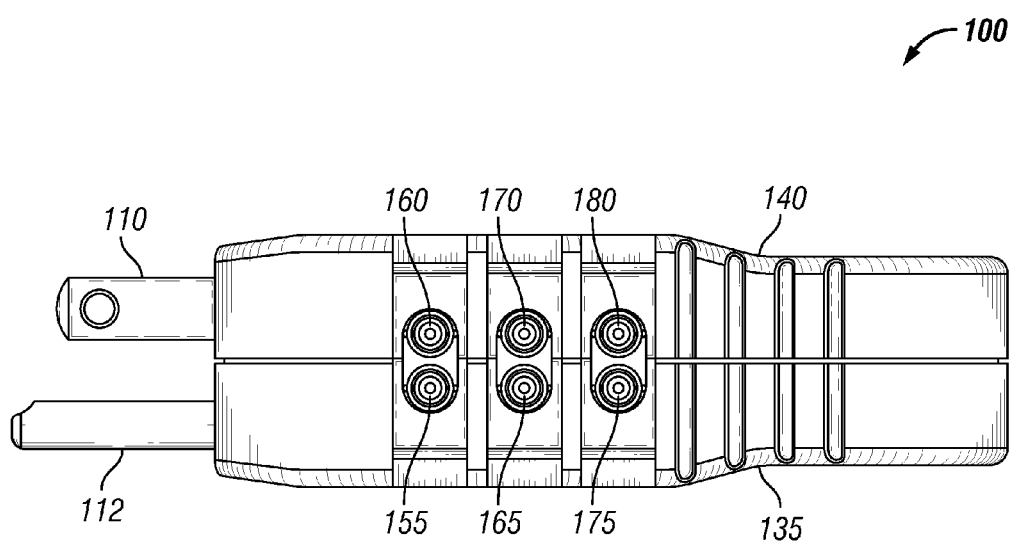
FIG. 1C is a side elevation view of the combination receptacle and modular plug circuit testing device of FIG. 1A in accordance with one exemplary embodiment.
Figure 1D:
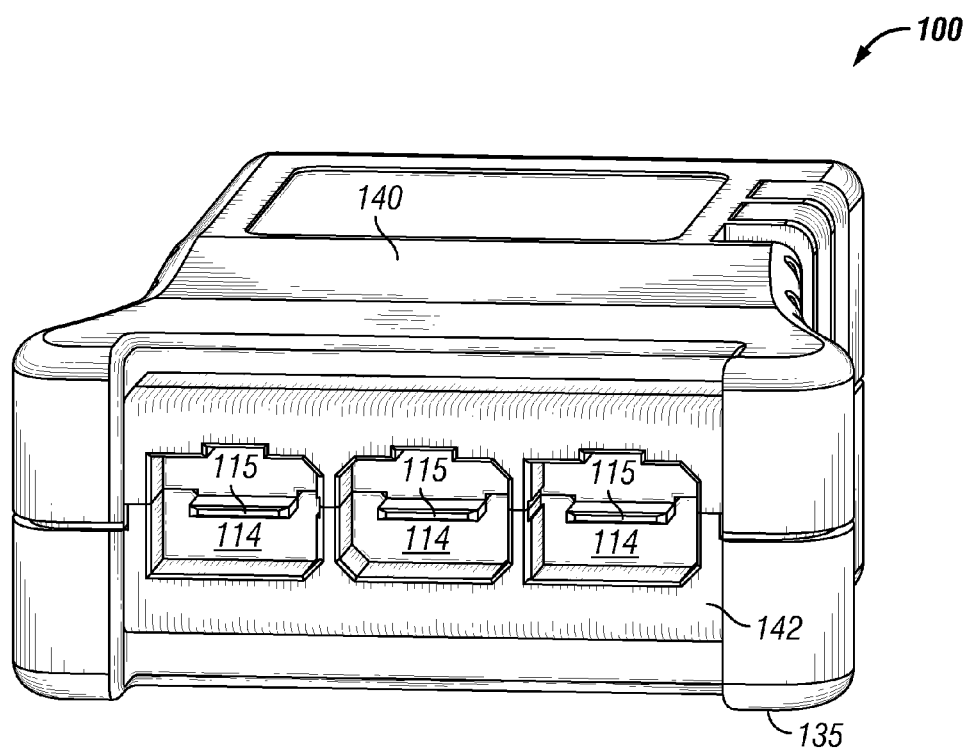
FIG. 1D is a rear perspective view of the combination receptacle and modular plug circuit testing device of FIG. 1A in accordance with one exemplary embodiment.

The exemplary embodiments presented herein are directed to systems, methods, and devices for a combination receptacle and plug circuit tester. FIGS. 1A-D present various external views of a combination receptacle plug circuit tester and modular plug circuit tester 100 according to one exemplary embodiment. Referring now to FIGS. 1A-D, the exemplary plug and receptacle circuit tester 100 includes a housing 105. In certain exemplary embodiments, the housing 105 is made of plastic or any other non-conductive material. The housing 105 can be constructed of one or more pieces and in certain exemplary embodiments includes a top housing section 135 and a bottom housing section 140 that are configured to be coupled together. The top 135 and bottom 140 housing sections can be coupled in a number of ways, including snap-fitting or coupling the two sections together with fasteners, such as screws, rivets or other fastening means known to those of ordinary skill in the art.

The housing 105 has a front side 141, a back side 142 and lateral sides 143, 144 disposed between the front 141 and back 142 sides. In certain exemplary embodiments, each lateral side 143, 144 includes multiple raised and indented portions to make the housing 105 easier to grip and the back side 142 is wider than the front side 141 to also make the housing 105 better conform to a user's hand and to make it easier to pull the prongs 110, 112 out of a receptacle. In addition, positioned between the two pieces 135, 140 of the exemplary housing 105 is an internal cavity portion 203 (FIG. 2A) that is defined by the sides 141-144 and the top and bottom sections 135, 140 and that is configured to house the electrical and/or electronic components of the device 100.

The front side 141 of the housing 105 includes a receptacle circuit tester that includes conventional receptacle prongs 110, 112 extending out from the front side 141 of the housing 105. In one exemplary embodiment the prongs include two blade prongs 110 and a ground prong 112. The back side 142 of the housing 105 includes a plug circuit tester with one or more cavities 114. In one exemplary embodiment, the plug circuit tester is configured to test a modular plug electrically coupled to the wiring system of a building and designed to be electrically coupled to a wall receptacle, switch or other electrical device to provide electrical power to the wall receptacle, switch or other electrical device. In one exemplary embodiment, the back side includes three horizontally aligned cavities 114 and a wall that extends vertically between each cavity 114 and separates each cavity 114. In an alternative embodiment, the walls between the cavities are not included and instead a single cavity is provided on the back side 142. Each cavity 114 is shaped and sized to receive a portion of a modular plug having one or more specific shapes. In addition, the cavity 114 is sized and shaped to prevent certain modular plugs from being inserted into the cavities 114. In certain exemplary embodiments each cavity or the single cavity is keyed or shaped to receive the plug to be inserted therein in only one orientation. In one exemplary embodiment, the modular plug can take any of the forms provided in U.S. Design application Nos. 29/351,064; 29/351,063; 29/385,606; or 29/385,608, and U.S. patent application Ser. Nos. 12/627,487 and 12/627,469, the entire contents of which are incorporated herein by reference for all purposes.

Within each cavity 114 is a blade prong 115 configured to electrically couple to the modular plug. Each exemplary blade prong 115 is disposed horizontally in its respective cavity 114. In certain alternative embodiments, each blade prong is disposed vertically in its respective cavity and the blades extend vertically along planes that are parallel or substantially parallel with one another. In alternative embodiments where the is only a single cavity, multiple blade prongs 115 are disposed within the cavity 115. In certain exemplary embodiments, the blade prongs 115 are linearly aligned or positioned parallel or substantially parallel to one another. In one exemplary embodiment, the blade prongs 115 and the prongs 110, 112 are made of metal or any other electrically conductive material.

While the exemplary embodiment of FIGS. 1A-D presents the prongs 110, 112 for the conventional receptacle on one side 141 of the housing 105 and the cavities 114 and blade prongs 115 positioned on the opposite side 142 of the housing 105, in alternative embodiments, each can be positioned on any side of the housing 105, including, for example, both being positioned on the same side of the housing 105. Furthermore, while the exemplary embodiment of FIGS. 1A-D present a modular plug circuit testing side that has male prongs 115 and is configured to receive a female modular plug, the design could be switched, such that the modular plug circuit testing side could include female blade receptacles or other known types of receptacles configured to receive a modular male plug. In another alternative embodiment, the cavities 114 are replaced with a conventional plug receptacle capable or receiving two blade prongs and a ground prong.

The housing 105 also includes a means for indicating an installation status. In one exemplary embodiment, the means for indicating an installation status includes three light emitting areas 120, 125, and 130 along one side of the housing 105. Each exemplary light emitting area 120, 125, and 130 includes an aperture providing a passageway from the exterior of the housing 105 to the internal cavity 203 of the housing 105. One or more light sources 155-180 are positioned through each aperture to emit a signal light that is emitted to an area outside of the housing 105. Each light emitting area also includes a unique colored, light-transmissive cover 120, 125, and 130. In one exemplary embodiment, the light emitting area 120 has a green light-transmissive cover, the light emitting area 125 has a yellow light-transmissive cover, and the light-emitting area 130 has a red light-transmissive cover. In an alternative embodiment, the light transmissive covers 120, 125, and 130 are clear or substantially clear and the light sources emit different non-white colored light. In one exemplary embodiment, the light transmissive covers 120, 125, and 130 are made of plastic or any other non-conductive material. While the exemplary embodiment presents covers in green, yellow, and red, the covers can be any color or any combination of colors. In the exemplary embodiment of FIGS. 1A-D, two light sources 155-160, 165-170, and 175-180 are vertically or substantially vertically aligned in each aperture and behind each respective light-transmissive cover 120, 125, 130. Each pair of light source 155-180 emits light through its respective light-transmissive cover 120, 125, 130. The light sources 155-180 can emit light of any color and can be any type of light source known to one of ordinary skill in the art including, but not limited to, neon lamps, light emitting diodes (LEDs), organic light emitting diodes (OLEDS), a liquid crystal display panel, an incandescent bulb, or the like. In the exemplary embodiment of FIGS. 1A-D, the light sources 155-180 and the light transmissive covers are configured to emit light along one side 144 of the housing. In alternative embodiments, it can be configured to emit light on any other side 141-143 or on the top 135 or bottom 140 portions of the housing 105.

The bottom housing section 140 also includes two separate areas of indicators provided along the outer surface. The first is a status indicator legend 145. The legend 145 provides an indication of the six possible outcomes for the circuit test as signaled by the light emitted through the light transmissive covers 120-130. In one exemplary embodiment, the legend 145 includes a listing of the following outcomes: open ground; open neutral; open hot; hot/ground reverse; hot neutral reverse; and correct. Next to each outcome is a three-color code that indicates that testing outcome. While presented on the bottom housing section 140 in FIG. 1B, the legend 145 can alternatively be placed on the top housing section 135, both housing sections 135, 140, or on any side of the housing 105.

The light sources 155-180 with the assistance of the colored, light-transmissive covers 120-130, provide an indication of differing circuit conditions. While the color and combination of light sources 155-180 being activated for each condition are many and changing them in a minor fashion is within the scope of this disclosure, in one exemplary embodiment, the signals for certain conditions are as follows. When an open ground circuit condition occurs (i.e. the ground conductor on the device being tested is not connected) the green indicator 120 and the yellow indicator 125 are illuminated on the device 100 at the same time. The signal for an open neutral circuit condition (i.e. the neutral conductor on the device being tested is not connected) is the yellow indicator 125 being illuminated on the device 100. The signal for an open hot circuit condition (i.e. the hot conductor on the device being tested is not connected) is none of the indicators being illuminated on the device 100. The signal for the hot and ground conductors being reversed on the device being tested is the yellow indicator 125 and the red indicator 130 being illuminated on the device 100 at the same time. The signal for the hot and neutral conductors being reversed is the green 120, yellow 125, and red 130 indicators being illuminated on the device 100 at the same time. The signal that the electrical device being tested has been wired correctly is the green indicator 120 being illuminated on the device 100. The signaling of correct wiring with a single lamp or light indicator is also different from other conventional testers, each which typically signals a correctly wired circuit with the activation of multiple light sources.

The bottom housing section 140 also includes a positioning legend 150 positioned adjacent to the entry point of each cavity 114. Each positioning legend 150 provides an indication of which portion of the plug or modular plug goes into a particular cavity 114 or portion of a single cavity. For example, above one cavity is a symbol representing a "neutral" designation, above the next cavity 114 is a symbol representing a "ground" designation, and above the third cavity 114 is a symbol representing a "hot" designation. The combination of the keyed cavities 114 with the positioning legend, makes it easier for testers to know how to quickly insert the module plug to achieve a proper test result.

Figure 2A:
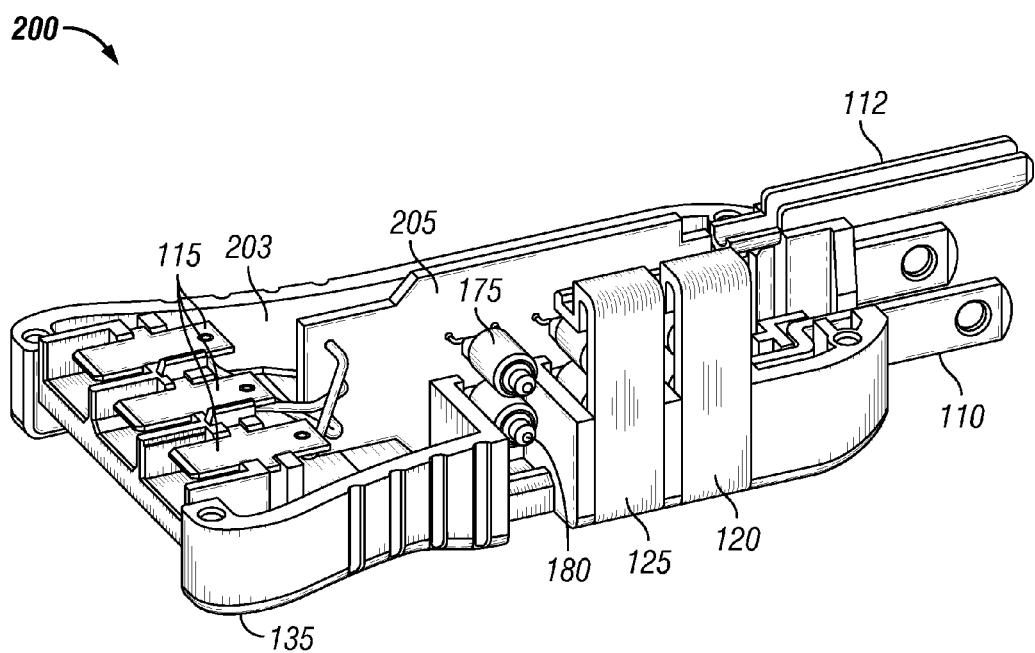
FIG. 2A is a partial cut-away view showing certain internal components of the combination receptacle and modular plug circuit testing device in accordance with one exemplary embodiment.
Figure 2B:
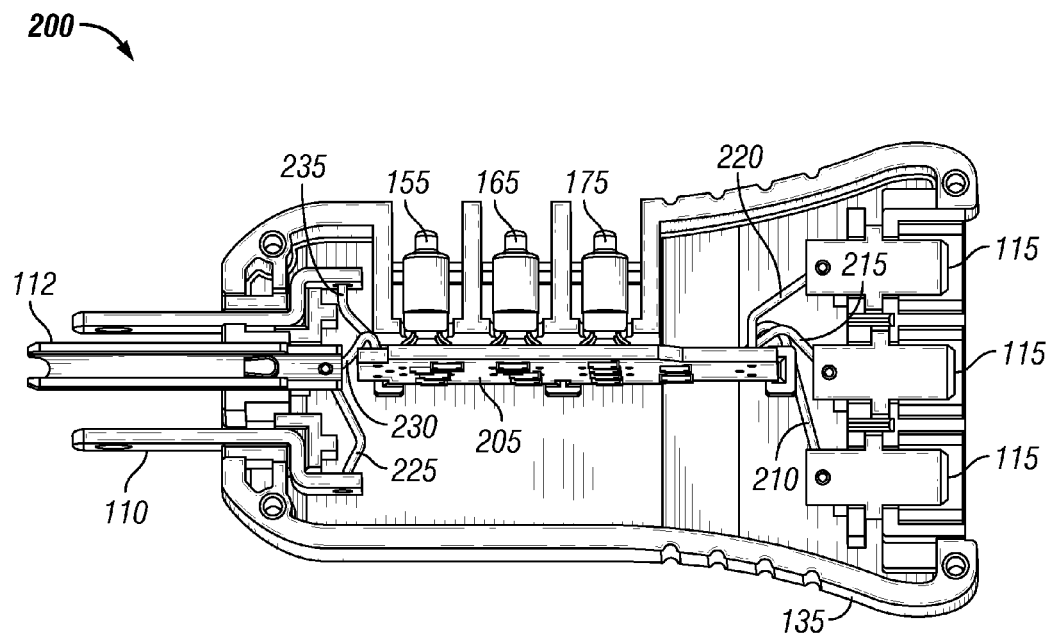
FIG. 2B is a top plan view of the cut-away of FIG. 2A in accordance with one exemplary embodiment.

FIGS. 2A and 2B present two cut-away views 200 of some of the internal components of the circuit tester 100 of FIG. 1. Referring now to FIGS. 2A and 2B, the exemplary cavity 203 of the housing 105 includes one or more printed circuit boards (PCB) 205 for providing control features for the circuit tester 100. In one exemplary embodiment, the light sources 155-180 are electrically coupled to the PCB 205. Alternatively, the light sources 155-180 are physically disposed on the PCB 205

In the exemplary embodiment of FIGS. 2A and 2B, the receptacle blade prongs 110 and ground prong 112 are electrically coupled to the PCB 205 by wires 225, 235, and 230 respectively. In addition, the blade prongs 115 are electrically coupled to the PCB 205 by wires 210, 215, and 220. In alternative embodiments, the prongs 110, 112 and/or the blade prongs 115 are directly coupled to the PCB 205.

Figure 3:
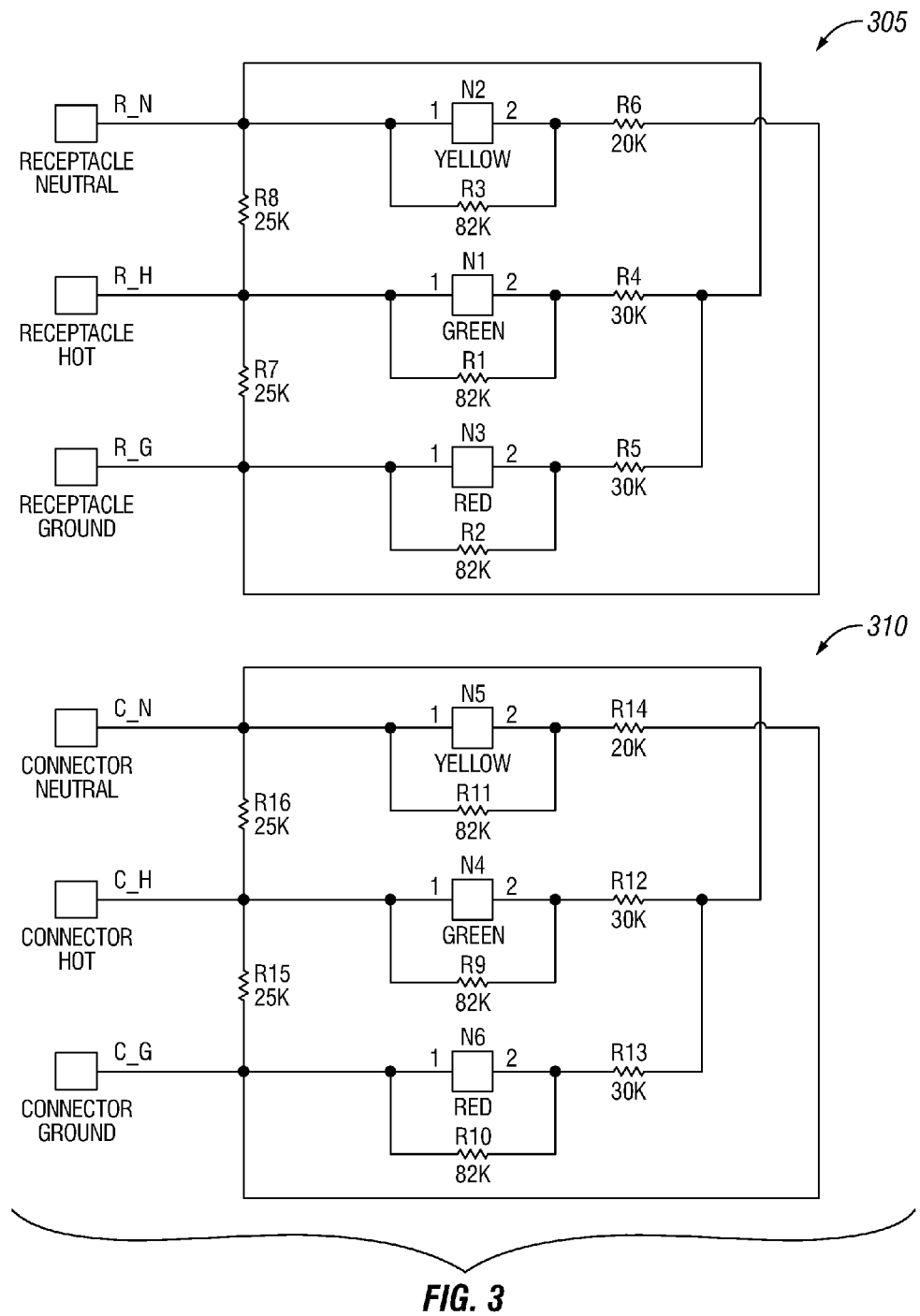
FIG. 3 is a schematic diagram of the dual circuit system of the combination receptacle and modular plug circuit testing device of FIGS. 1 and 2 in accordance with one exemplary embodiment.

FIG. 3 is an exemplary schematic diagram of a dual circuit system 300 for use in the plug tester 100 in accordance with one exemplary embodiment. Now referring to FIGS. 1-3, the control circuit schematic 300 for the circuit tester 100 includes two separate circuits 305, 310 that are electrically isolated from one another on the PCB 205. The first circuit 305 controls the testing and test features for the convention plug receptacle with the blade prongs 110 and ground prong 112. The second circuit 310 controls the testing and test features for the modular plug circuit testing side having the keyed cavities 114 and three horizontal (or vertical) blade prongs 115. Each exemplary circuit 305, 310 is electrically coupled to one set (155, 165, and 175 or 160, 170, and 180) of the light sources. In one exemplary embodiment, both circuits 305, 310, while electrically isolated from one another, are disposed on the one PCB 205. In alternative embodiments, each circuit 305, 310 is on a separate PCB (not shown).

By isolating the testing circuits 305, 310 and test features from one-another, a user can insert the prongs 110, 112 into a conventional receptacle and test the conventional receptacle circuit without having to manipulate a switch or cover the cavities 114 to prevent a shock hazard. Conversely, when a user is testing a modular plug circuit by plugging it into the cavities 114 and blade prongs 115, the user does not have to manipulate a switch or cover the prongs 110, 112 to prevent a shock hazard from occurring. Further, with isolated circuits 305, 310 and each circuit having its own set of light sources to indicate a circuit test result, it is possible to use both sides of the circuit tester device 100 at the same time to test a conventional receptacle circuit and a modular plug circuit simultaneously.

FIGS. 4A-D present various views of an alternative embodiment of a receptacle and plug circuit tester device 400 according to an alternative embodiment. The operation of the device 400 is substantially similar to the device 100 and will not be repeated. However, the device 400 includes a manually adjustable sliding switch 425 positioned along one side of the housing 405. Similar to that described above with reference to the tester 100, the device 400 includes a housing 405. A modular plug circuit tester having a single cavity 445 and three blade prongs 450 linearly aligned within the cavity 445 is provided on the top housing section. The cavity 445 is configured to receive a plug, such as a modular plug 505 shown in FIG. 4A. As discussed above, in alternative embodiments, the device could be alternatively configured to receive a conventional plug in the cavity 445, with the prongs being modified accordingly to be individual receptacles that receive the conventional 3-prong plug design. When the cavity 445 is not in use, the device 400 can also include a cavity cover 452 that closes off access to the cavity 445. In one exemplary embodiment, the cavity cover 452 is made of a non-conductive material, such as plastic, and is configured to have a snap-fit seal with the cavity 445 to hold the cover 452 in place.

The light sources 431, 436. and 441 and the light transmissive covers 430, 435, and 440 are positioned along the back side of the housing 405. Retractable blade 470, 490 and ground 480 prongs representing a conventional plug are movably positioned on the opposing front side of the housing 405. In one exemplary embodiment, the blade 470, 490 and ground 480 prongs are configured to extend and retract though openings 410 and 415 respectively on the front side of the housing 405. The light sources 431, 436, and 441 and the blade 470. 490 and ground 480 prongs and the cavity blades 450 are electrically coupled to the PCB 495.

Figure 4A:
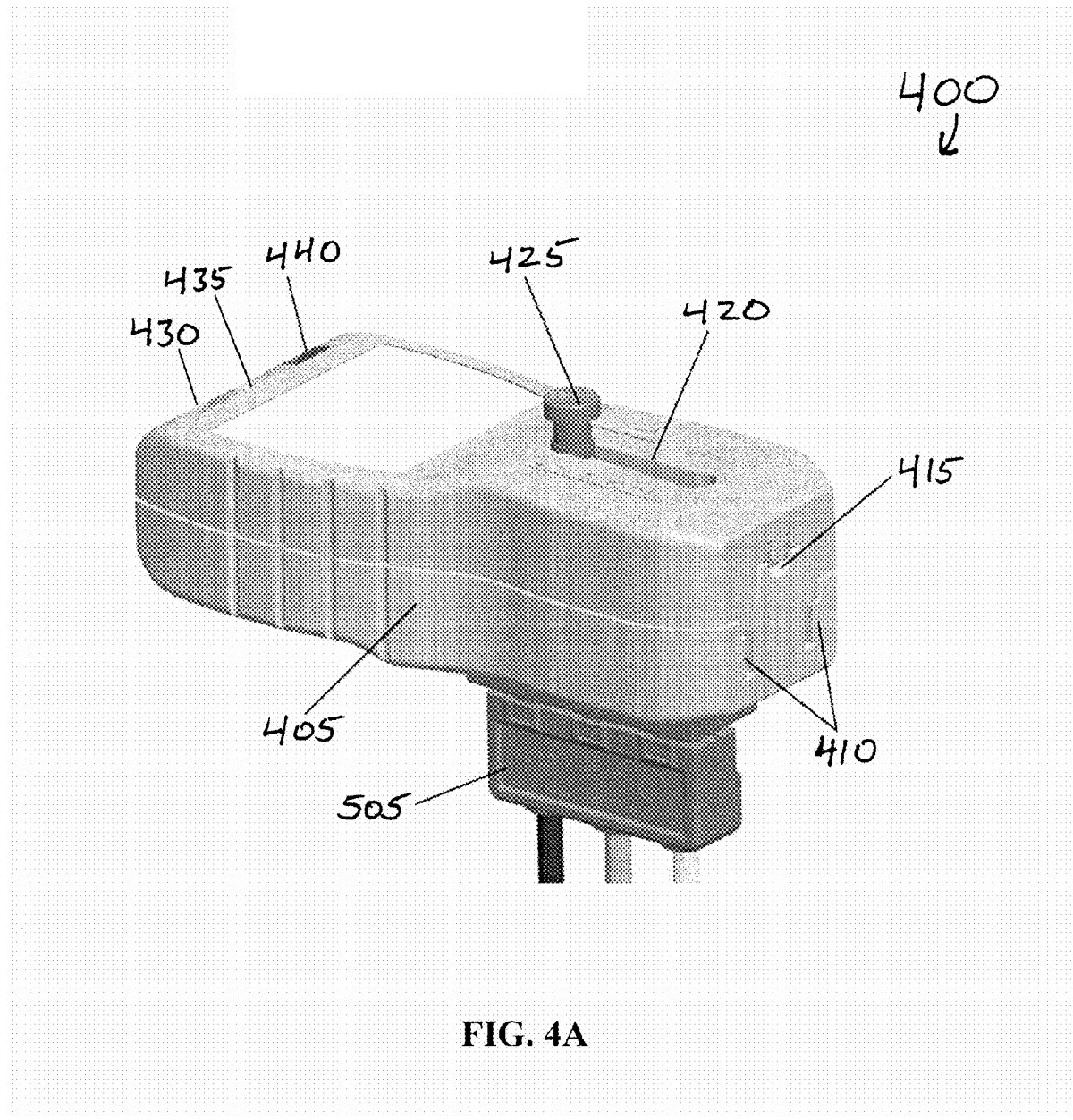
FIG. 4A is a perspective view of the an alternative combination receptacle and modular plug circuit testing device in accordance with another exemplary embodiment.
Figure 4B:
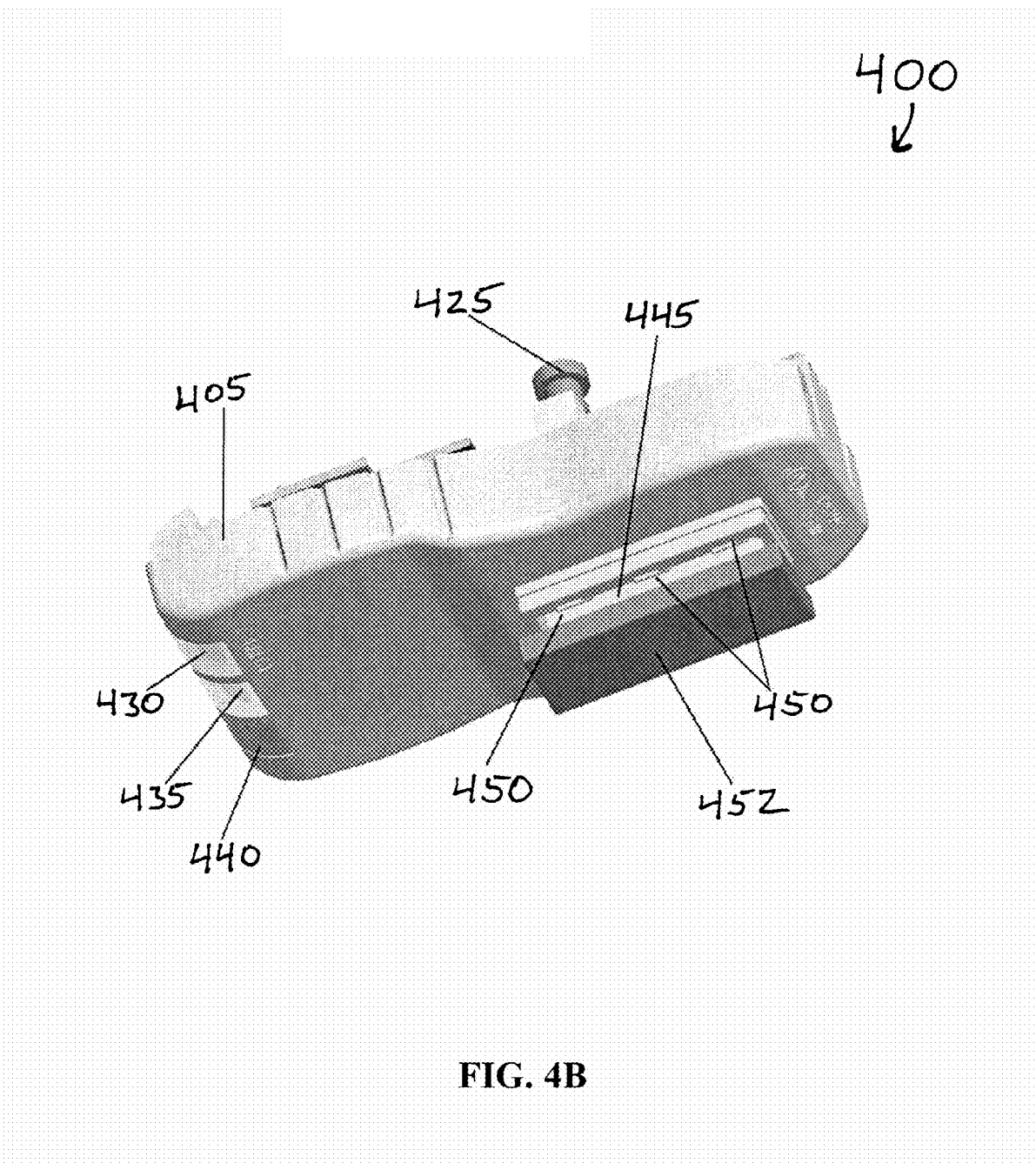
FIG. 4B is another perspective view of the alternative combination receptacle and modular plug circuit testing device of FIG. 4A in accordance with another exemplary embodiment.
Figure 4C:
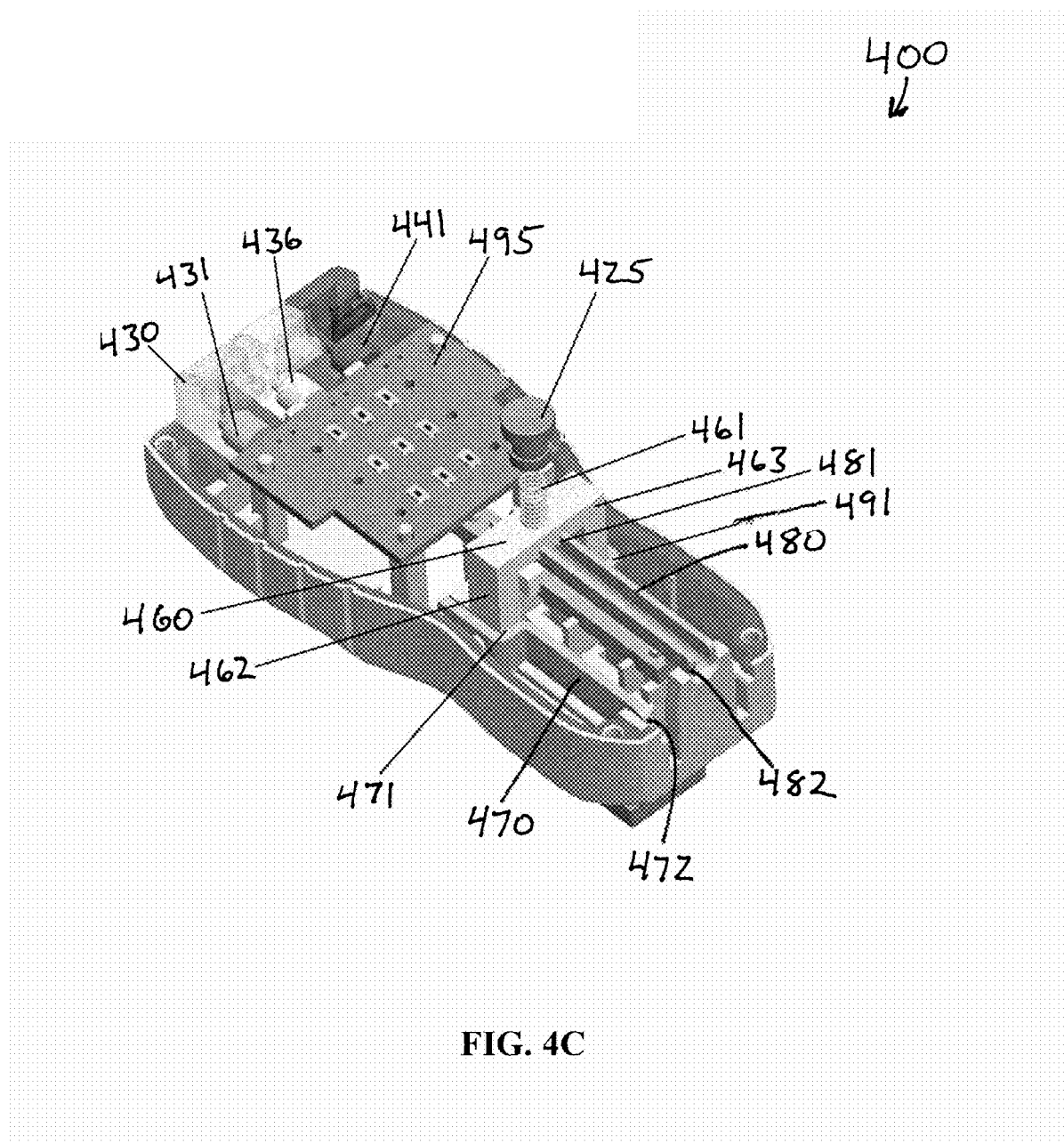
FIG. 4C is a cut-away view of the internal components of the alternative combination receptacle and modular plug circuit testing device of FIG. 4A presenting a slide switch in a first position in accordance with one exemplary embodiment.
Figure 4D:
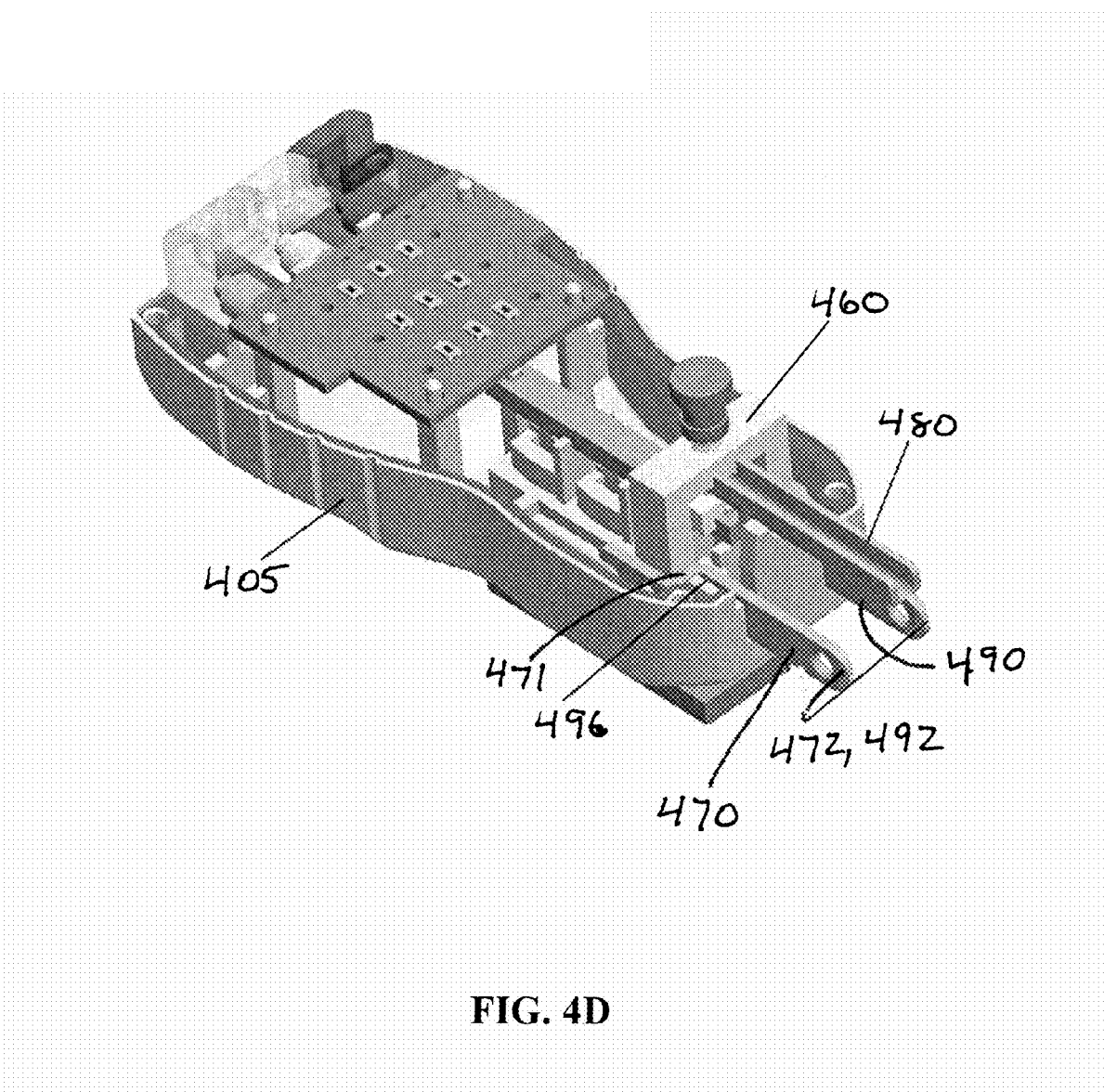

The bottom housing section includes an elongated slot 420 and a sliding switch 425 extending up through the slot 420. The switch 425 is configured to slide along the slot 420 from a first position to a second position to extend and retract the prongs 470, 480, and 490. The switch 425 includes a switch handle a horizontal switch platform 460 and two arms 462, 463 extending in a substantially vertical direction down from the switch platform 460. A threaded rod extends vertically up from the platform 460 and the switch handle 425 is threadably coupled to the threaded knob with a spring 461 disposed between the handle 425 and the switch platform 460. FIG. 4C shows the switch 425 in the first position and FIG. 4D shows the switch 425 in the second position with the prongs 470, 480, and 490 extending out from the housing 405. In one exemplary embodiment, the switch 425 is spring enabled, such that when the switch 425 is moved from the first position to the second position (or vice-versa), the switch knob is depressed downward against the spring 461 and held down while the switch 425 is moved. When the move is complete, the downward force on the spring is removed and the switch knob moves back up and the switch 425 is no longer capable of moving.

The prong 470 is made of a conductive material and includes an elongated member with a first end 472 for engaging a plug receptacle. The prong 470 includes a second member 471 coupled to the elongated member and configured to be abutted and pushed by one of the arms 462 of the switch. In one exemplary embodiment, the second member 471 is coupled at an orthogonal or substantially orthogonal angle to the elongated member. In the second position, the opposing side of the second member 471 abuts a position stop 496 to prevent the prong 470 from being further extended out of the housing.

The prong 490 is made of a conductive material and includes an elongated member with a first end 492 for engaging a plug receptacle. The prong 490 includes a second member 491 coupled to the elongated member and configured to be abutted and pushed by one of the arms 463 of the switch 425. In one exemplary embodiment, the second member 491 is coupled at an orthogonal or substantially orthogonal angle to the elongated member. In the second position, the opposing side of the second member 491 abuts a position stop (not shown) to prevent the prong 490 from being further extended out of the housing.

The ground prong 480 is made of a conductive material and includes an elongated member with a first end 482 for engaging a ground receptacle. The opposing distal end 481 is configured to abut against and be pushed by the switch 425. In one exemplary embodiment, the distal end 481 of the ground prong 480 abuts the switch platform 460. Further, in certain exemplary embodiments, the ground prong 480 and the blade prongs 470 and 490 are coupled to the switch 425 by welding, screws, rivets, or other known attachment mechanisms known to those of ordinary skill in the art.

In one exemplary embodiment, the switch 425 is placed in the first position (i.e. one end of the slot 420) when the modular plug circuit tester is in use and is placed in the second position (i.e. the opposing end of the slot 420) when the conventional receptacle circuit testing portion of the device 400 is in use. In certain exemplary embodiments, the switch 425 acts to electrically isolate the portion of the circuit testing device being used from the portion of the circuit testing device not currently in use.

Although the inventions are described with reference to preferred embodiments, it should be appreciated by those skilled in the art that various modifications are well within the scope of the invention. From the foregoing, it will be appreciated that an embodiment of the present invention overcomes the limitations of the prior art. Those skilled in the art will appreciate that the present invention is not limited to any specifically discussed application and that the embodiments described herein are illustrative and not restrictive. From the description of the exemplary embodiments, equivalents of the elements shown therein will suggest themselves to those skilled in the art, and ways of constructing other embodiments of the present invention will suggest themselves to practitioners of the art. Therefore, the scope of the present invention is not limited herein.

We claim:

1. A hand-held apparatus for testing electrical circuits comprising:
   a housing;
   a first circuit tester extending out from a first portion of the housing and comprising a plurality of conductive prongs configured to be inserted into a conventional electrical receptacle;
   a second circuit tester disposed along a second portion of the housing and comprising at least one cavity for receiving one of an electrical plug and a modular plug therein, wherein the second circuit tester is electrically isolated from the first circuit tester;
   one or more indicators provided along a surface of the housing and configured to provide a visual indication of an outcome of a circuit test for at least one of the first and second circuit tester; and
   an adjustable switch disposed in a slot along the surface of the housing and configured to slide along the slot from a first position that extends the plurality of conductive prongs to a second position that retracts the plurality of conductive prongs.

2. The hand-held apparatus of claim 1, wherein the first circuit tester comprises:
   a circuit disposed on a printed circuit board, the circuit configured to test the conventional electrical receptacle;
   the plurality of conductive prongs electrically coupled to the circuit and configured to be inserted into the conventional electrical receptacle; and
   wherein the one or more indicators is electrically coupled to the circuit.

3. The hand-held apparatus of claim 1, wherein the second circuit tester comprises:
   a circuit disposed on a printed circuit board, the circuit configured to test the modular plug;
   at least one blade prong disposed within each cavity and configured to be inserted into a receptacle portion of the modular plug; and
   wherein the one or more indicators is electrically coupled to the circuit.

4. The hand-held apparatus of claim 1, wherein the second circuit tester comprises:
   a circuit disposed on a printed circuit board, the circuit configured to test the electrical plug;
   a plurality of cavities disposed along a surface of the housing, each cavity configured to receive a conductive portion of the electrical plug;
   at least one electrical contact disposed within each cavity and configured to abut the conductive portion of the electrical plug received through the respective cavity; and wherein the one or more indicators is electrically coupled to the circuit.

5. The hand-held apparatus of claim 1, wherein the one or more indicators comprises:
a first plurality of light sources electrically coupled to the first circuit tester; and
a second plurality of light sources electrically coupled to the second circuit tester.

6. The hand-held apparatus of claim 5, wherein each of the first plurality of light sources emits light though a corresponding light-transmissive cover, wherein each of the corresponding light-transmissive covers is a different color.

7. The hand-held apparatus of claim 5, wherein each of the second plurality of light sources emits light though a corresponding light-transmissive cover, wherein each of the corresponding light-transmissive covers is a different color.

8. The hand-held apparatus of claim 1, wherein the first portion of the housing and the second portion of the housing are opposite to each other.

9. The hand-held apparatus of claim 8, wherein the second circuit tester comprises three linearly aligned cavities, each cavity comprising at least one blade prong configured to be inserted into a portion of the electrical plug inserted into the respective cavity.

10. The hand-held apparatus of claim 8, wherein the second circuit tester comprises the cavity comprises a plurality of linearly aligned blade prongs, each blade prong configured to be inserted into a portion of the electrical plug inserted into the cavity.

11. A hand-held apparatus for testing electrical circuits comprising:
a non-conductive housing comprising:
a plurality of side walls;
a top wall coupled to the plurality of side walls;
a bottom wall coupled to the plurality of side walls; and
a cavity defined by the top, bottom and plurality of side walls;
a printed circuit board (PCB) disposed within the cavity of the housing and comprising a first electrical circuit and a second electrical circuit, wherein the second electrical circuit is electrically isolated from the first electrical circuit;
a first electrical circuit tester electrically coupled to the first electrical circuit on the PCB and comprising a plurality of prongs extending out from said housing, wherein the prongs are configured to engage an electrical receptacle;
a second electrical circuit tester electrically coupled to the second electrical circuit on the PCB and comprising at least one cavity for receiving at least a conductive portion of a plug therein;
a plurality of light sources electrically coupled to the PCB, wherein the light sources indicate an outcome of a circuit test for at least one of the first and second circuit tester; and
an adjustable switch disposed in a slot along the surface of the housing and configured to slide along the slot from a first position that extends the plurality of prongs to a second position that retracts the plurality of prongs.

12. The hand-held apparatus of claim 11, wherein the plurality of light sources comprises:
a first plurality of light sources electrically coupled to the first electrical circuit; and
a second plurality of light sources electrically coupled to the second electrical circuit.

13. The hand-held apparatus of claim 12, wherein the first and second plurality of light sources comprise light emitting diodes.

14. The hand-held apparatus of claim 12,
wherein the first plurality of light sources comprise:
a first light emitting diode (LED);
a second LED; and
a third LED;
wherein the second plurality of light sources comprise:
a fourth LED;
a fifth LED; and
a sixth LED;
wherein the first and fourth LED are aligned in a first vertical column, the second and fifth LED are aligned in a second vertical column and the third and sixth LED are aligned in a third vertical column, wherein the first, second, and third vertical columns are adjacent to each other; and
wherein the first, second, and third LEDs are aligned in one horizontal row and the fourth, fifth, and sixth LEDs are aligned in a second horizontal row.

15. The hand-held apparatus of claim 12,
wherein the first plurality of light sources comprise:
a first light emitting diode (LED);
a second LED; and
a third LED;
wherein the second plurality of light sources comprise:
a fourth LED;
a fifth LED; and
a sixth LED;
and wherein the hand-held apparatus further comprises:
a first light-transmissive cover coupled to the housing, wherein the first and fourth LEDs are positioned behind and emit light through the first light-transmissive cover;
a second light-transmissive cover coupled to the housing, wherein the second and fifth LEDs are positioned behind and emit light through the second light-transmissive cover; and
a third light-transmissive cover coupled to the housing, wherein the third and sixth LEDs are positioned behind and emit light through the third light-transmissive color.

16. The hand-held apparatus of claim 15, wherein the first, second, and third light transmissive covers each emit a different color of light.

17. The hand-held apparatus of claim 11, wherein the second circuit tester comprises three linearly aligned cavities, each cavity comprising at least one blade prong configured to be inserted into a portion of the electrical plug inserted into the respective cavity.

18. The hand-held apparatus of claim 1, wherein the second portion of the housing is wider than the first portion of the housing such that the housing conforms to a user's hand.

19. The hand-held apparatus of claim 1, further comprising: a status indicator legend disposed along the surface of the housing, wherein the status indicator legend comprises a listing of one or more outcomes of the circuit test and their respective color code, wherein each color code represents a respective outcome of the circuit test.

20. The hand-held apparatus of claim 1, further comprising: a positioning legend disposed adjacent to an entry point of the at least one cavity to provide an indication of which portion of one of the electrical plug and the modular plug goes into the at least one cavity.

* * * * *